(12) United States Patent
Fukuda

(10) Patent No.: US 8,599,619 B2
(45) Date of Patent: Dec. 3, 2013

(54) MEMORY SYSTEM

(75) Inventor: Koichi Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 267 days.

(21) Appl. No.: 13/230,029

(22) Filed: Sep. 12, 2011

(65) Prior Publication Data

US 2012/0069666 A1  Mar. 22, 2012

(30) Foreign Application Priority Data

Sep. 22, 2010 (JP) ................................ 2010-211966

(51) Int. Cl.
*G11C 11/34* (2006.01)
(52) U.S. Cl.
USPC ............. 365/185.21; 365/185.12; 365/185.14
(58) Field of Classification Search
USPC ............. 365/185.18, 185.03, 185.11, 185.05, 365/185.13, 185.19, 185.21, 185.12, 365/185.14, 185.24
See application file for complete search history.

(56) References Cited

U.S. PATENT DOCUMENTS

| | | | | |
|---|---|---|---|---|
| 6,320,785 B1 * | 11/2001 | Yoshida et al. | ......... | 365/185.03 |
| 6,650,568 B2 * | 11/2003 | Iijima | ..................... | 365/185.18 |
| 6,809,967 B2 | 10/2004 | Noguchi et al. | | |
| 6,870,773 B2 | 3/2005 | Noguchi et al. | | |
| 6,958,938 B2 | 10/2005 | Noguchi et al. | | |
| 6,987,695 B2 * | 1/2006 | Park et al. | ................ | 365/185.18 |
| 7,649,776 B2 | 1/2010 | Abiko et al. | | |
| 7,916,547 B2 | 3/2011 | Hosono | | |
| 8,009,480 B2 | 8/2011 | Abiko et al. | | |
| 8,203,885 B2 | 6/2012 | Abiko et al. | | |
| 2002/0141242 A1 | 10/2002 | Noguchi et al. | | |
| 2004/0179403 A1 | 9/2004 | Noguchi et al. | | |
| 2005/0157558 A1 | 7/2005 | Noguchi et al. | | |
| 2007/0253254 A1 * | 11/2007 | Morooka et al. | ......... | 365/185.18 |
| 2008/0239812 A1 | 10/2008 | Abiko et al. | | |

(Continued)

FOREIGN PATENT DOCUMENTS

| | | |
|---|---|---|
| JP | 2002-324400 | 11/2002 |
| JP | 2008-251138 | 10/2008 |
| JP | 2009-70501 | 4/2009 |
| JP | 2010-40109 | 2/2010 |

OTHER PUBLICATIONS

Office Action issued Jan. 4, 2013 in Japanese Application No. 2010-211966 (With English Translation).

(Continued)

*Primary Examiner* — Harry W Byrne
*Assistant Examiner* — Hien Nguyen
(74) *Attorney, Agent, or Firm* — Oblon, Spivak, McClelland, Maier & Neustadt, L.L.P.

(57) ABSTRACT

A memory system includes a controller and a memory part including a memory cell array including memory cells, word lines, bit lines including bit line pairs each composed of an even bit line and an odd bit line adjacent to each other, and sense amplifiers provided to the bit line pairs and configured to detect data in selected memory cells connected to a selected word line. When reading data is performed from first memory cells to which writing data is performed first in memory cell pairs each including two adjacent memory cells respectively connected to one of the even bit lines and one of the odd bit lines, the controller controls the memory part so as to change a read level voltage applied to the selected word line depending on a data write state of second memory cells in the memory cell pairs to which writing data is performed later.

13 Claims, 8 Drawing Sheets

(56) References Cited

U.S. PATENT DOCUMENTS

2010/0037007 A1 2/2010 Futatsuyama et al.
2010/0080061 A1 4/2010 Abiko et al.
2010/0329036 A1* 12/2010 Park .................. 365/185.25
2011/0267884 A1 11/2011 Abiko et al.

OTHER PUBLICATIONS

Office Action issued Jun. 14, 2013 in Japanese Patent Application No. 2010-211966 with English language translation.

* cited by examiner

FIG. 5A  Even BL Page

FIG. 5B  Odd BL Page

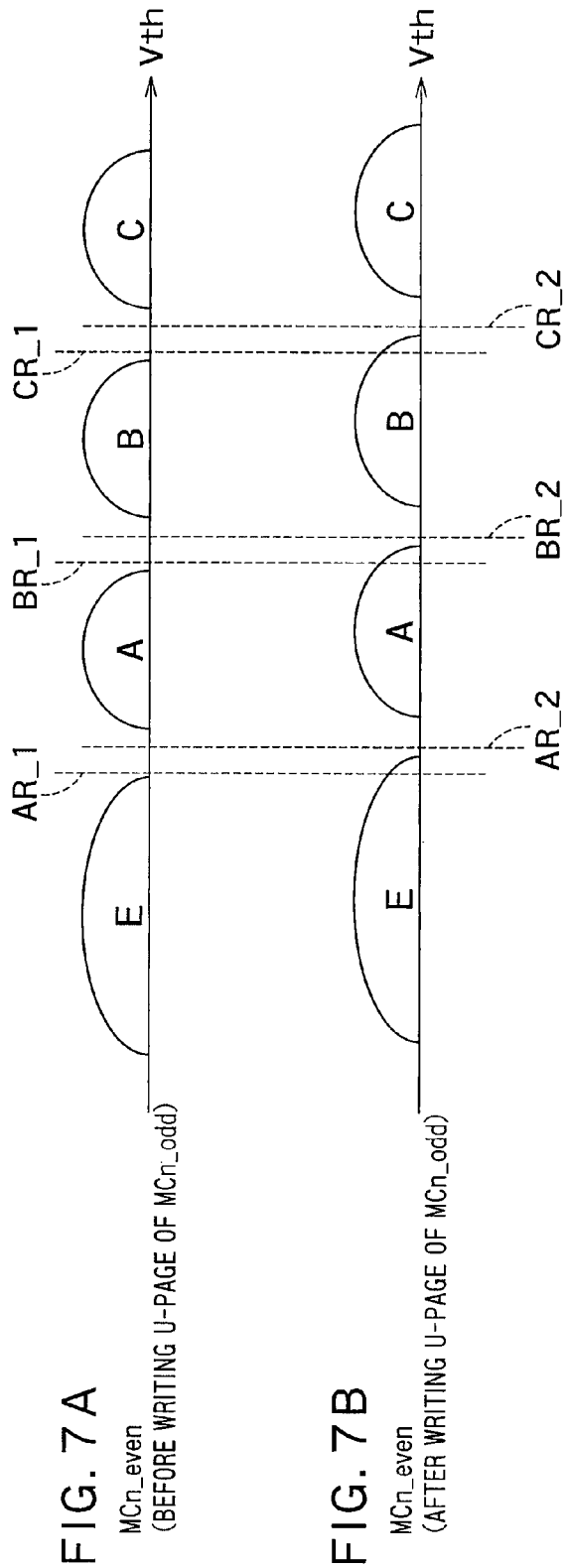

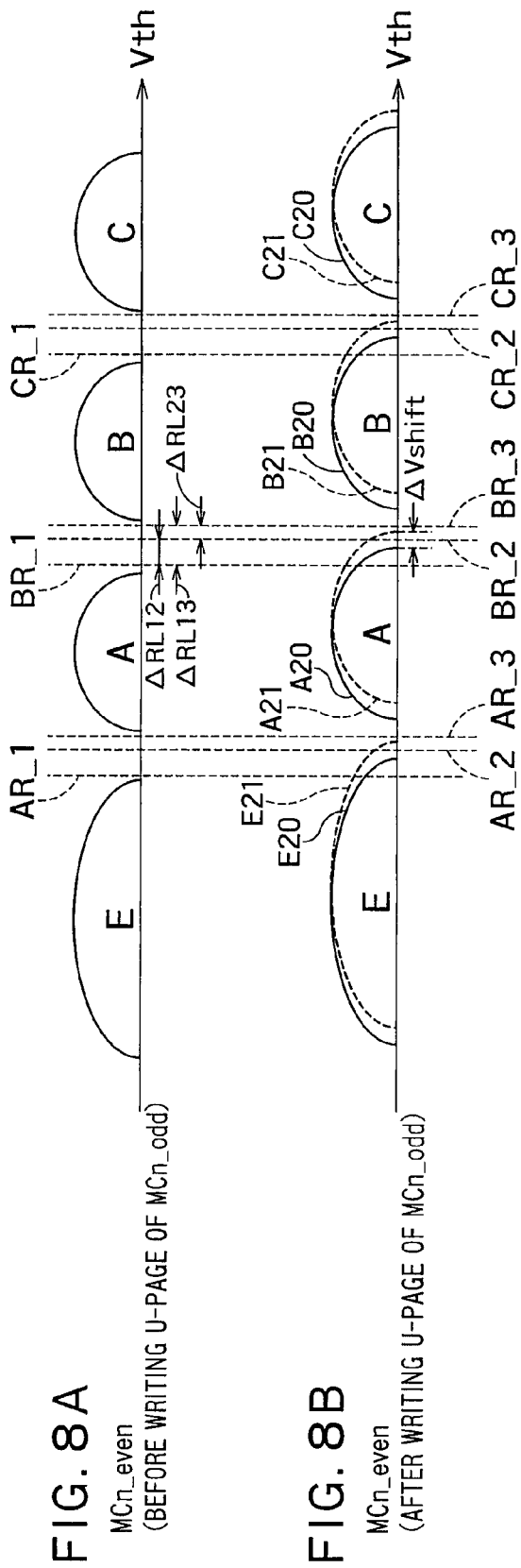

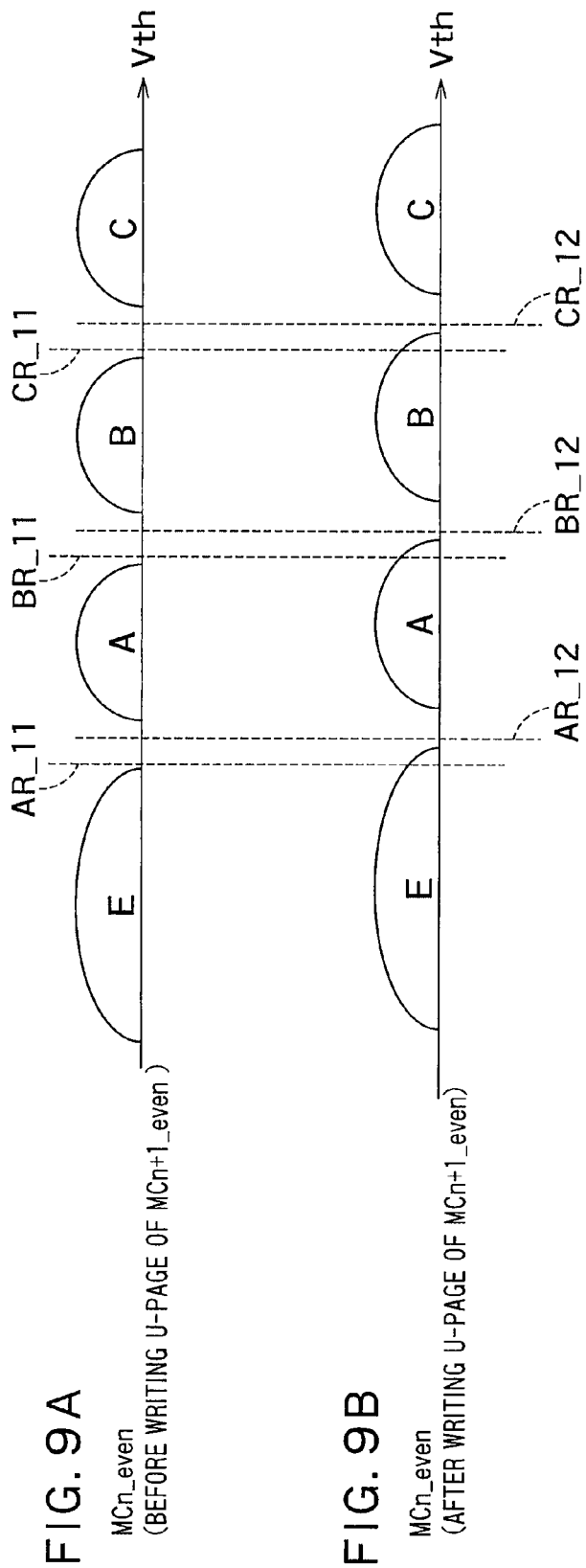

MEMORY SYSTEM

CROSS REFERENCE TO RELATED APPLICATIONS

This application is based upon and claims the benefit of priority from the prior Japanese Patent Application No. 2010-211966, filed on Sep. 22, 2010, the entire contents of which are incorporated herein by reference.

FIELD

The embodiment of the present invention relates to a memory system.

BACKGROUND

In NAND flash memory systems, a multilevel technique enabling to store data of two or more bits in one memory cell is widely used to cut bit cost. Furthermore, downscaling of memory cells has been advanced to reduce the chip size. Under these circumstances, widening of threshold distributions caused by interference between adjacent cells (inter-cell interference effect) is not negligible. The inter-cell interference effect is a phenomenon that the threshold voltage of a memory cell to which data is already written shifts by writing data to an adjacent memory cell. The inter-cell interference effect possibly causes widening of threshold voltage distributions of memory cells and degradation of reliability of reading data.

As measures against the problem, there are known the following techniques. According to one technique (Technique 1), the inter-cell interference effect is suppressed by changing a page write order. According to another technique (Technique 2), data is read from a word line adjacent to a read-target word line, and a read level at a time of reading data from the read-target word line is changed based on the data read from the adjacent word line, thereby correcting the inter-cell interference effect derived from the adjacent memory cell connected to the adjacent word line.

BRIEF DESCRIPTION OF THE DRAWINGS

FIGS. 7A and 7B show relations between threshold distributions and read levels of a NAND flash memory system according to the first embodiment;

FIGS. 8A and 8B show relations between threshold distributions and read levels of a NAND flash memory system according to the third embodiment; and FIGS. 9A and 9B show relations between threshold distributions and read levels of a NAND flash memory system according to the fourth embodiment.

DETAILED DESCRIPTION

According to an embodiment of the present invention, a memory system includes a controller and a memory part including a memory cell array including a plurality of memory cells, a plurality of word lines connected to control gates of the memory cells, a plurality of bit lines connected to the memory cells and including bit line pairs each composed of an even bit line and an odd bit line adjacent to each other, and sense amplifier circuits provided to the bit line pairs, respectively, and configured to detect data in selected memory cells connected to a selected word line among the word lines based on a current flowing through the selected memory cells.

When reading data is performed from first memory cells to which writing data is performed first in memory cell pairs each including two adjacent memory cells respectively connected to one of the even bit lines and one of the odd bit lines, the controller controls the memory part so as to change a read level voltage applied to the selected word line depending on a data write state of second memory cells in the memory cell pairs to which writing data is performed later.

Embodiments will now be explained with reference to the accompanying drawings.

(First Embodiment)

Figure 1:
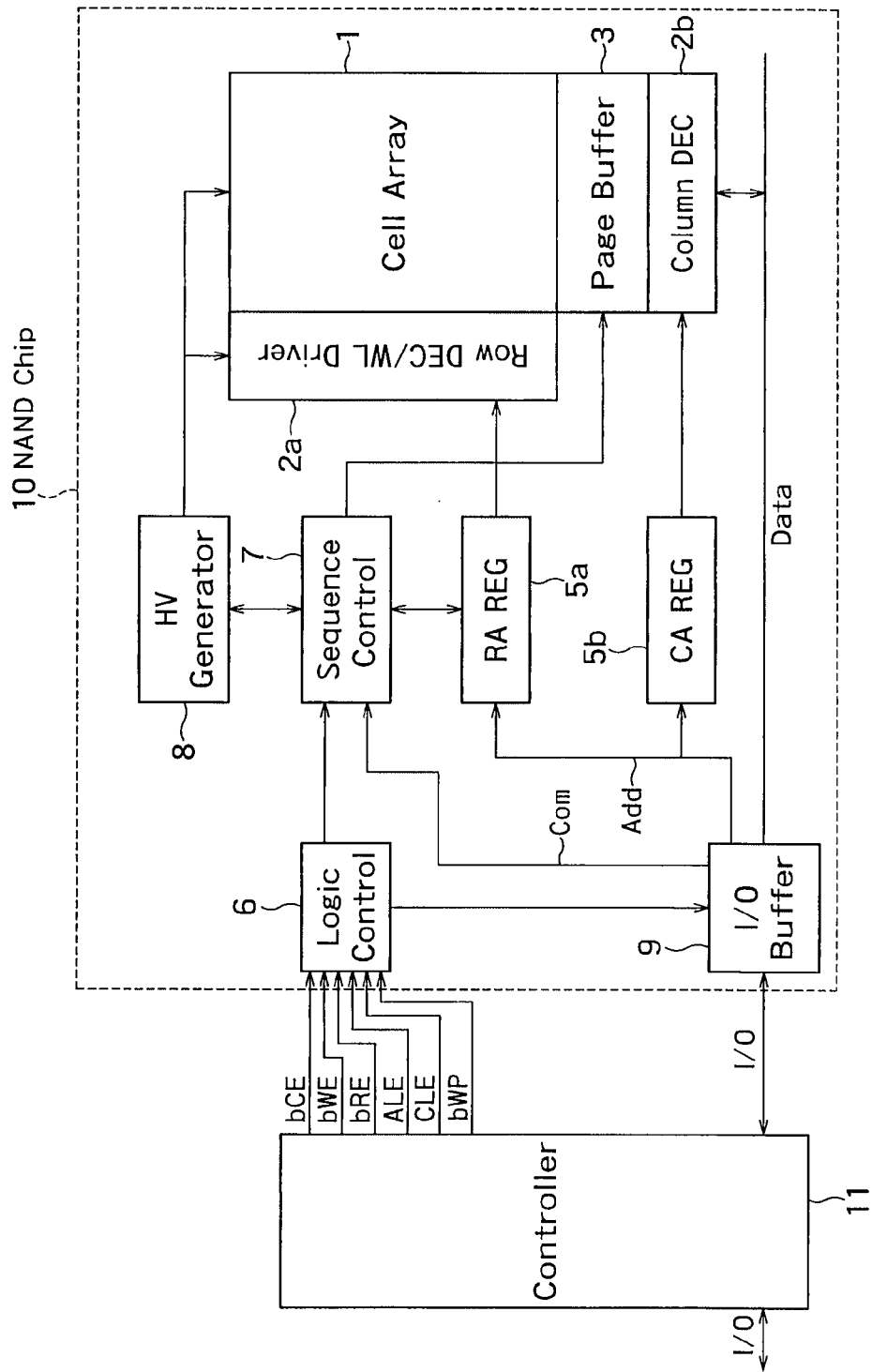
FIG. 1 is a block diagram showing a configuration of a NAND flash memory system according to a first embodiment.

FIG. 1 is a block diagram showing a configuration of a NAND flash memory system (hereinafter, also simply "memory system") according to a first embodiment of the present invention. The NAND flash memory system according to the first embodiment includes a NAND chip 10 and a controller 11 controlling the NAND chip 10. The NAND chip 10 and the controller 11 can be resin-sealed into one package as a multi chip package (MCP).

A memory cell array 1 that is a constituent element of the NAND chip 10 includes a plurality of floating-gate memory cells MC two-dimensionally arranged in a matrix. A row decoder/word line driver 2a, a column decoder 2b, a page buffer 3, and a high voltage generator 8 constitute a data read/write circuit writing and reading data to or from the memory cell array 1 on a page basis. The row decoder/word line driver 2a drives word lines and select gate lines in the memory cell array 1. The page buffer 3 includes sense amplifier circuits SA and a data latch circuit corresponding to one page, and reads and writes data from and to the memory cell array 1 on the page basis.

The column decoder 2b selects a column in the page buffer 3 when the read data is output from and the write data is loaded to the page buffer 3. The read data corresponding to one page in the page buffer 3 is sequentially output column-by-column to external I/O terminals via an I/O buffer 9. The write data supplied from the I/O terminals is sequentially loaded to the page buffer 3 column-by-column. The write data corresponding to one page is loaded to the page buffer 3. A row address signal and a column address signal are input to the NAND chip 10 via the I/O buffer 9 and transferred to the row decoder/word line driver 2a and the column decoder 2b, respectively. A row address register 5a holds an erase block address in an erase operation and holds a page address in a write operation or a read operation. An initial column address used to load the write data before start of the write operation or an initial column address used to output the read data after the read operation is input to a column address register 5b. The column address register 5b holds the input column address until a write enable signal bWE or a read enable signal bRE is toggled under predetermined conditions.

A logic control circuit 6 controls input of commands or addresses and controls input/output of data based on such control signals as a chip enable signal bCE, a command-latch enable signal CLE, an address-latch enable signal ALE, the write enable signal bWE, and the read enable signal bRE. The read or write operation is executed in response to the commands. Upon receipt of the commands, a sequence control circuit 7 executes a read, write, or erase sequence control. The high voltage generator 8 generates predetermined voltages necessary for various operations under control of the sequence control circuit 7.

The controller 11 executes a data write/read control under conditions suited for a current write state of the NAND chip 10. Needless to say, the NAND chip 10 can execute a part of the read control to be described later.

Figure 2:
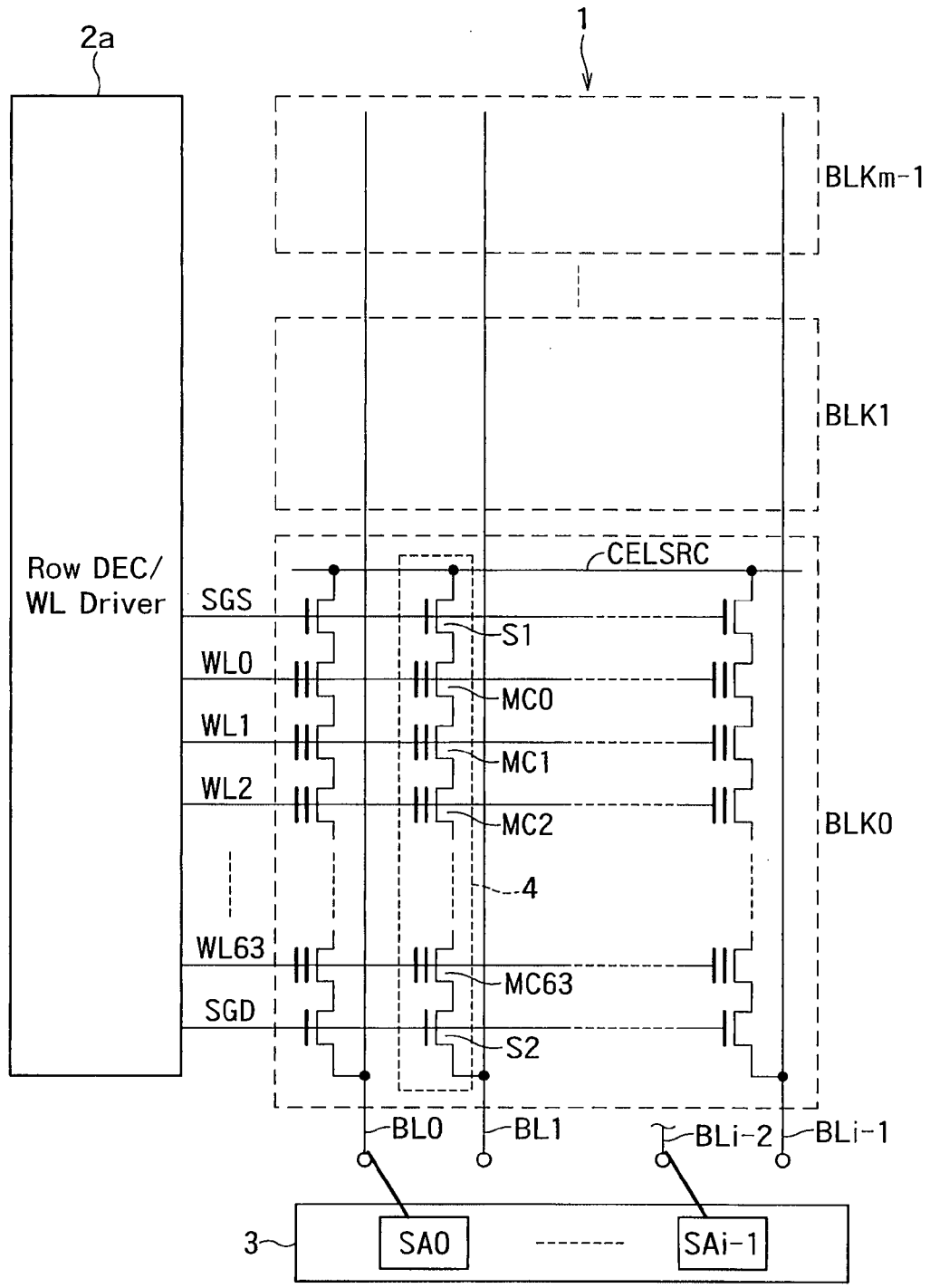
FIG. 2 shows a specific configuration of the memory cell array 1.

FIG. 2 shows a specific configuration of the memory cell array 1. In the example of FIG. 2, 64 memory cells MC0 to MC63 connected in series and select gate transistors S1 and S2 connected to opposite ends of the series-connected memory cells MC0 to MC63, respectively, constitute each NAND cell unit (a NAND string) 4. A source side terminal of the select gate transistor S1 is connected to a common source line CELSRC and a drain side terminal of the select gate transistor S2 is connected to a bit line BL (one of BL0 to BLi−1). Control gates of the memory cell MC0 to MC63 are connected to word lines WL (WL0 to WL63), respectively, and gates of the select transistors S1 and S2 are connected to select gate lines SGS and SGD, respectively.

A group of a plurality of memory cells MC connected to one word line WL constitutes a page that is a unit for reading or writing data in a lump. Furthermore, a group of a plurality of NAND cell units 4 arranged in a word line direction constitutes a cell block BLK that is a unit for erasing data in a lump. In FIG. 2, a plurality of cell blocks BLK0 to BLKm−1 sharing the bit lines BL are arranged in a bit line direction to constitute the memory cell array 1. The row decoder/word line driver 2a drives the word lines WL and the select gate lines SGS and SGD. The bit lines BL are connected to the sense amplifier circuits SA (SA0 to SAi−1) included in the page buffer 3, respectively.

Operations performed by the memory system according to the first embodiment configured as described above are described next.

Note that "page" has three different meanings in the following descriptions.

First, a page means a "page" as a unit for data access in a lump along one word line WL. In this case, access methods include a method of accessing all the memory cells connected to one word line in a lump (ABL (All-Bit-Line) method) and a method of accessing every other memory cells (alternately) (conventional method or bit-line-shield method). In the case of the former method, all the memory cells connected to a selected word line can be simultaneously accessed and the memory cells constitute one page. In the case of the latter method, only a half of the memory cells connected to the selected word line can be simultaneously accessed because only even or odd bit lines BL can be selected. That is, with the conventional method, the "page" is allocated to correspond to the memory cells connected to the even bit lines or the odd bit lines adjacent to the even bit lines. In this case, the memory cells connected to the even bit lines and those connected to the odd bit lines are allocated to different pages, respectively. To prevent confusion of pages in the case of the ABL method, pages in the case of the conventional method are referred to as "even" pages and "odd" pages.

When ABL sense amplifier circuits are used as the sense amplifier circuits SA, the sense amplifier circuits SA perform a sensing operation by applying a current to all the bit lines in the cell array 1. The ABL sense amplifier circuits SA continuously apply the current to the bit lines BLi throughout the sensing operation, thereby always fixing voltages of the bit lines BLi to a certain voltage. It is accordingly possible to eliminate fluctuations in bit line voltages and prevent generation of capacitive coupling noise between the adjacent bit lines to enable simultaneous reading of data from all bit lines.

Figure 3A:
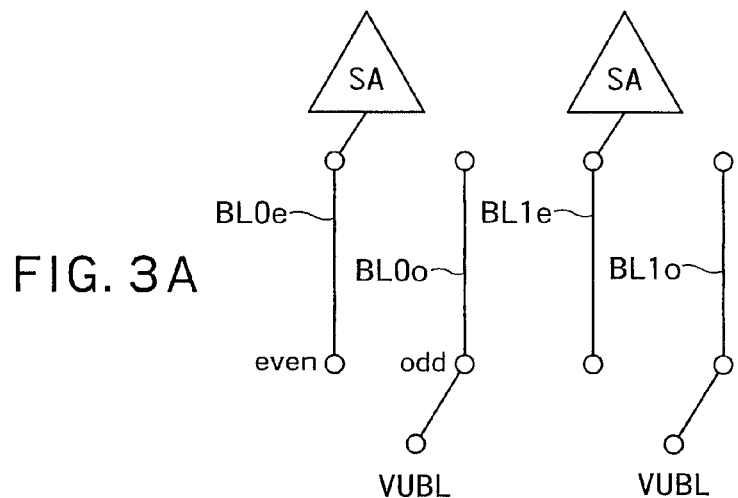
FIG. 3A is a schematic diagram showing connection between the sense amplifier circuits and the bit lines in the conventional bit-line-shield method.
Figure 3B:
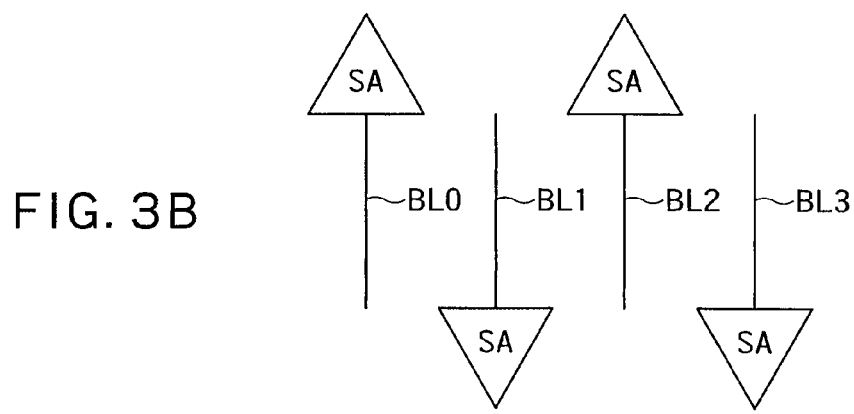
FIG. 3B is a schematic diagram showing connection between the sense amplifier circuits and the bit lines in the ABL (all-bit-line) method.

FIG. 3A is a schematic diagram showing connection between the sense amplifier circuits of the conventional method and the bit lines. FIG. 3B is a schematic diagram showing connection between the ABL sense amplifier circuits and the bit lines. When the sense amplifier circuits of the conventional method are used as the sense amplifier circuits SA, the sense amplifier circuits SA are connected to every other bit line BL in the sensing operation as shown in FIG. 3A. Voltages of the bit lines BL that are not connected to the sense amplifier circuits SA are fixed to a source voltage via a VUBL. This can prevent generation of noise resulting from influences of the adjacent bit lines BL. In this case, the write operation and read operation are performed separately for even BL pages (BL0e and BL1e) and odd BL pages (BL0o and BL1o). In the case of the ABL method shown in FIG. 3B, the sense amplifier circuits SA are provided to each of the bit lines BL, respectively. With the ABL method, the sense amplifier circuits SA can simultaneously detect data in the memory cells connected to the bit lines BL in all columns. In the following embodiments, the sense amplifier circuits of the conventional method are used as the sense amplifier circuits SA unless otherwise specified.

Second, a page means a "page" indicating a hierarchical level of stored data when multilevel data is stored in one memory cell. For example, when two-bit (four-level) data is stored in one memory cell, pages corresponding to the two bits are referred to as "an L (Lower) page" and "a U (Upper) page".

Third, a page means a "page" for specifying an access order in consideration of the data access unit and the hierarchical level of stored data. For example, when two-bit data according to the ABL method is stored in the memory cells connected to the 64 word lines in one block, 128 pages are allocated to the block. In the case of two-bit data according to the conventional method, 256 pages are allocated to the block. A last page address L and an access page address P (described later) are addresses based on the third page.

Figure 4:
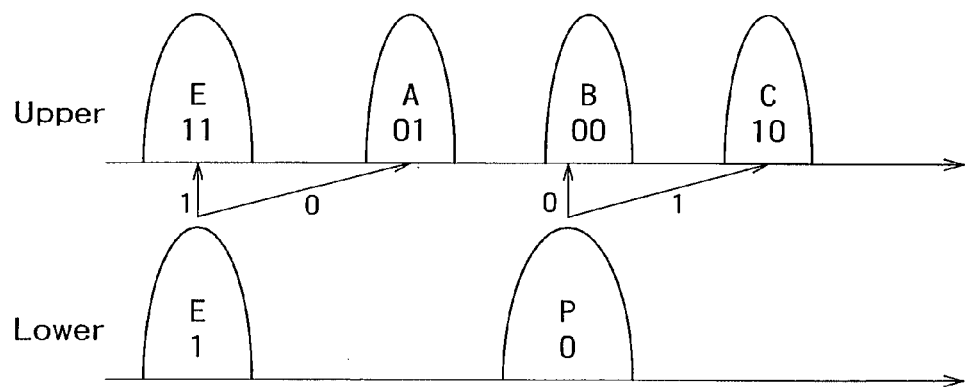
FIG. 4 shows threshold distributions of memory cells MC when ordinary two-bit data is written to each memory cell MC.

In the first embodiment, two-bit data is stored in one memory cell MC. FIG. 4 shows threshold distributions of memory cells MC when ordinary two-bit data is written to each memory cell MC. Thresholds of all the memory cells MC in one block are set to a lowest "E (erase)" level as a result of block erase. At the time of writing of an L page, the threshold voltage of the memory cell MC storing "0" as L page data is raised to a "P" level. The "P" level threshold voltage distribution widens according to the influence of writing data to adjacent memory cells MC to which is performed later. At the time of subsequently writing to a U page, four narrow threshold distributions "E", "A", "B", and "C" corresponding to data "11", "01", "00", and "10", respectively, are generated according to the U page data. In this case, the lowest threshold distribution "E" is not shifted in level and the threshold distribution "A" at the second lowest level is generated by shifting from the threshold distribution "E". The higher threshold distributions "B" and "C" are generated by shifting from the threshold distribution "P".

Figure 6:
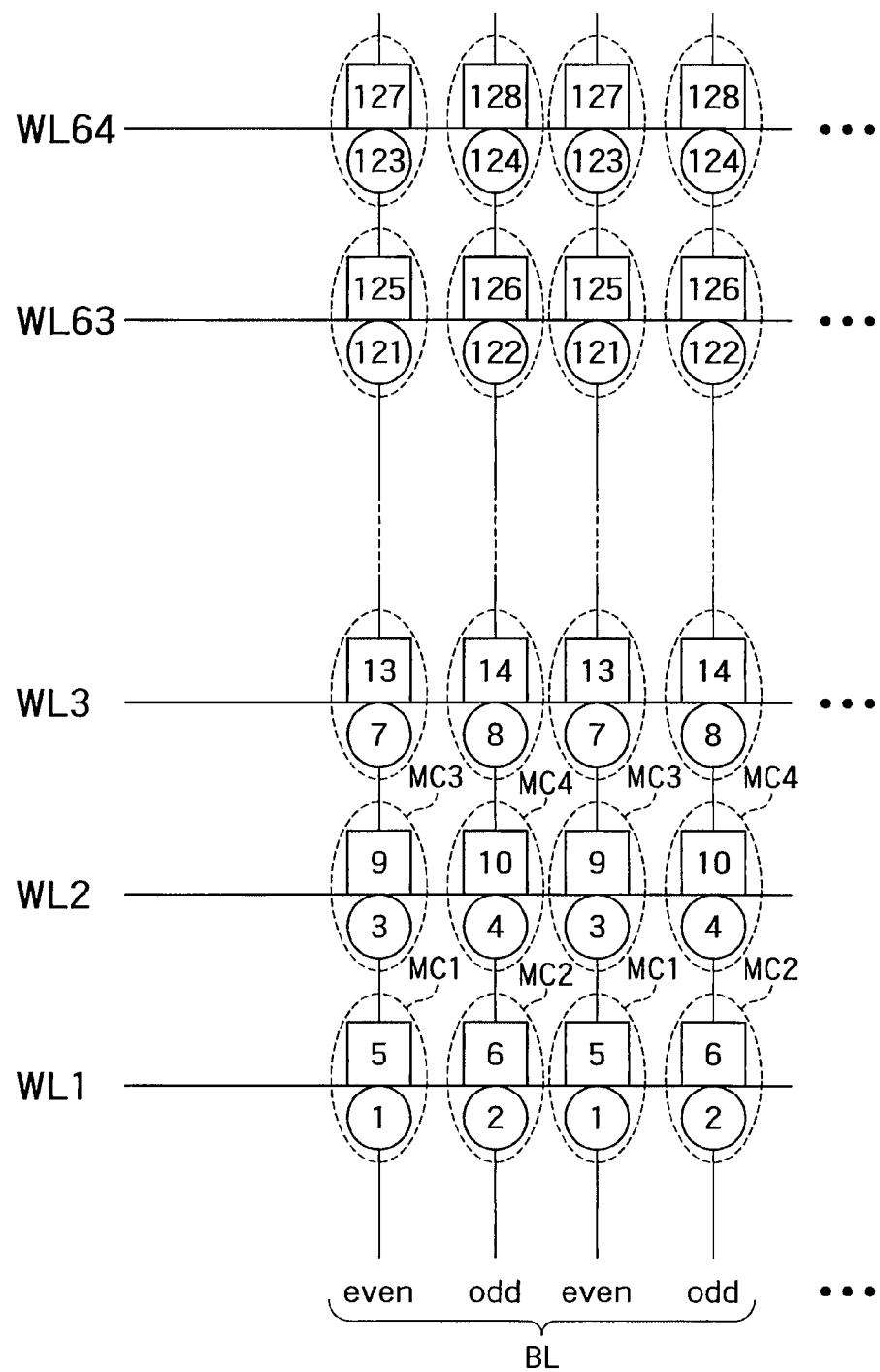
FIG. 6 shows a page write order in one memory block. It is assumed that L pages indicated by "circles" differ from U pages indicated by "rectangles" and that data is alternately written to even BL pages and odd BL pages.

FIG. 6 shows a page write order in one memory block. It is assumed that L pages indicated by "circles" differ from U pages indicated by "rectangles" and that even BL pages and odd BL pages are alternately written. Numbers in the "circles" indicating the L pages and those in the "rectangles" indicating the U pages denote the page write order. By writing pages in the order shown in FIG. 6, once an U page is written, only U page writing but no L page writing to adjacent memory cells to the memory cells of the U page is performed. This can suppress widening of the threshold distributions of the memory cell due to the inter-cell interference effect to some extent. Note that notations of "even" and "odd" for the bit lines BL are defined for the sake of convenience and can be replaced by each other.

Figure 5:
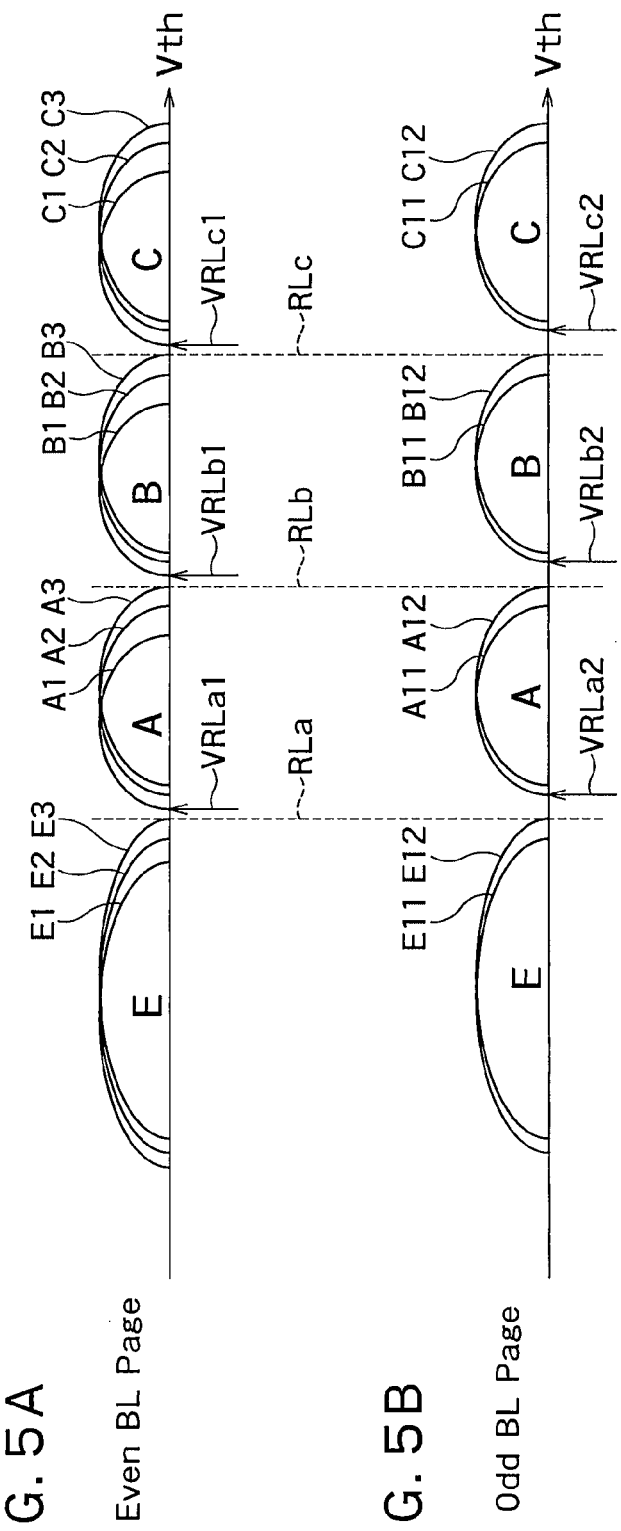
FIGS. 5A and 5B show changes in threshold distributions of memory cells on even BL(bit line) pages and odd BL pages by inter-cell interference effect, respectively.

However, as shown in FIGS. 5A and 5B, when writing the U page of first memory cells is performed and then writing U pages of second memory cells adjacent to the first memory cell, the threshold voltage distributions of the first memory cells widens and shift to a high voltage side. FIGS. 5A and 5B show changes in threshold voltage distributions of memory cells on even BL pages and odd BL pages, respectively. Right after writing U pages of memory cells on even BL pages connected to a word line WLn is performed, the memory cells on the even BL pages have threshold voltage distributions indicated by E1, A1, B1, and C1 as shown in FIG. 5A. Thereafter, when writing U pages of memory cells on odd BL pages connected to the word line WLn is performed, the threshold voltage distributions of the memory cells on the even BL pages connected to the word line WLn shift to those indicated by E2, A2, B2, and C2, respectively, as shown in FIG. 5A. Furthermore, when writing the U pages of memory cells on even BL pages connected to a word line WLn+1, the threshold voltage distributions of the memory cells on the even BL pages connected to the word line WLn shift to those as indicated by E3, A3, B3, and C3, respectively, as shown in FIG. 5A.

For example, attention is paid to the memory cells MC1 shown in FIG. 6. After writing the U pages of the memory cells MC1 is performed, writing U pages of memory cells MC2 is performed. Because the memory cells MC2 are adjacent to the memory cells MC1, the threshold voltages of the memory cells MC1 shift according to writing the U pages of the memory cells MC2 mainly due to capacitive coupling between the adjacent memory cells. Next, writing L pages of the memory cells on even BL pages and odd BL pages connected to a word line WL3 is performed. At this time, the threshold voltages of the memory cells MC1 do not shift because the memory cells connected to the word line WL3 are not adjacent to the memory cells MC1. And then writing U pages of memory cells MC3 on the even BL pages connected to a word line WL2 is performed.

Because the memory cells MC3 are adjacent to the memory cells MC1, the threshold voltages of the memory cells MC1 shift according to writing the U pages of the memory cells MC3. Subsequently, writing U pages of memory cells MC4 on the odd BL pages connected to the word line WL2 is performed. Because the memory cells MC4 are arranged in a diagonal direction to the memory cells MC1, the distance of each memory cell MC4 to each memory cell MC1 is longer than those of the memory cells MC2 and MC3 to each memory cell MC1. Accordingly, writing the memory cells MC4 hardly influences the threshold voltages of the memory cells MC1. That is, the threshold voltages of the memory cells MC1 on the even BL pages shift according to the operations for writing U pages of the memory cells MC2 and MC3 adjacent to the memory cells MC1 (E1→E2→E3, for example). On the other hand, right after writing the U pages of the memory cells MC on the odd BL pages connected to the word line WLn is performed, the memory cells on the odd BL pages have threshold voltage distributions indicated by E11, A11, B11, and C11 as shown in FIG. 5B. Next, when writing the U pages of the memory cells on odd BL pages connected to the word line WLn+1 is performed, the threshold voltage distributions of the memory cells MC on the odd BL pages connected to the word line WLn shift to those indicated by E12, A12, B12, and C12, respectively, as shown in FIG. 5B.

For example, attention is paid to the memory cells MC2 shown in FIG. 6. After writing U pages of the memory cells MC2 is performed, writing L pages of memory cells on the even and odd BL pages connected to the word line WL3 is performed. At this time, the threshold voltages of the memory cells MC2 do not shift because the memory cells connected to the word line WL3 are not adjacent to the memory cells MC2. Subsequently, writing the U pages of the memory cells MC3 on the even BL pages connected to the word line WL2 is performed. Because the memory cells MC3 are arranged in a diagonal direction to the memory cells MC2, the distance of each memory cell MC3 to each memory cell MC2 is longer than those of the memory cells MC1 and MC4 to each memory cell MC2. Accordingly, writing the memory cells MC3 hardly influences the threshold voltages of the memory cells MC2. And then, writing the U pages of memory cells MC4 on the odd BL pages connected to the word line WL2 is performed. Because the memory cells MC4 are adjacent to the memory cells MC2, the threshold voltages of the memory cells MC2 shift according to writing the U pages of the memory cells MC4. That is, the threshold voltages of the memory cells MC2 on the odd BL pages shift according to the operation for writing the U pages of the memory cells MC4 adjacent to the memory cells MC2 (E11→E12, for example). Note that writing the U pages of the memory cells MC1 has no influence on the U pages of the memory cells MC2 because writing the U pages of the memory cells MC1 is performed before writing the U pages of the memory cells MC2 is performed. While the threshold voltage distributions of the L pages of the respective memory cells shift according to writing the adjacent memory cells, this does not cause a significant problem because thereafter writing the U page of each memory cell is performed. Nevertheless, the first embodiment can be applied to L pages as described later.

Conventionally, to deal with these changes in threshold distributions, verify-read levels and program voltages applied at the time of writing the even BL pages are set different from those applied at the time of writing the odd BL pages.

Furthermore, conventionally, the same read levels are used on the even BL pages and the odd BL pages at the time of reading data. In the example shown in FIGS. 5A and 5B, verify-read levels VRLa1, VRLb1, and VRLc1 are used on the even BL pages whereas verify-read levels VRLa2, VRLb2, and VRLc2 are used on the odd BL pages. The same read level RLa is used on the even BL pages and the odd BL pages at the time of reading data. Likewise, the same read levels RLb and RLc are used on the even BL pages and the odd BL pages.

Meanwhile, when the same read levels RLa, RLb, and RLc are used on the even BL pages and the odd BL pages in the data read operation, margins between the threshold voltages of the target memory cells and the read levels differ depending on a data write state of the memory cells adjacent to the target memory cells. For example, as shown in FIG. 5A, the distance between the distribution B1 and the read level RLb is relatively short and the margin is small accordingly. The distance between the distribution B3 and the read level RLb is relatively long and the margin is large accordingly. When the margin between the threshold voltage distribution and the read level RLb is large, data can be accurately read, which leads to improvement in reliability. As shown in FIG. 5B, the distance between the distribution B11 and the read level RLb is relatively short and the margin is small accordingly whereas the distance between the distribution B12 and the read level RLb is relatively long and the margin is large accordingly. The same is true for the other distributions A1 to A3 and the like.

Normally, the threshold voltage distributions of memory cells shift to a low voltage side over time elapsed since writing data is performed. This is because charges accumulated in the floating gates of the memory cells gradually decrease (electrons are gradually emitted from the floating gates) and the threshold voltages of the memory cells gradually decrease over time.

As a result, when read levels are adapted to the threshold voltage distributions affected by the inter-cell interference effect after writing U pages of the adjacent memory cells, the margin between the threshold voltage distribution and corresponding read level is reduced in case that writing U pages of the adjacent memory cells is not performed. Conversely, when the read levels are adapted to the threshold voltage distributions that is not affected by the inter-cell interference effect, the margin between the threshold distribution and corresponding read level is reduced in case that writing the U pages of the adjacent memory cells is performed.

According to the first embodiment, therefore, the read levels (read level voltages) applied to a selected word line are changed depending on the data write state of the adjacent memory cells. The read level refers to a voltage applied to the gates of selected memory cells (selected word line WLn) at the time of reading data. By setting each of the read levels at a value between the threshold voltage distributions of the memory cells, the selected memory cells turn on or off and a current flowing the selected memory cells changes. The sense amplifier circuit SA can detect data in the selected memory cells by sensing a difference in currents on the corresponding bit lines. Note that a high voltage VPASS is applied to unselected word lines corresponding to unselected memory cells other than the selected memory cell in the NAND cell unit 4, and that the unselected memory cells are in a highly ON state (a low resistance state) at the time of reading data from the selected memory cell.

Different page addresses are allocated to the odd BL page and the even BL page, respectively.

FIGS. 7A and 7B show relations between threshold voltage distributions and read levels of the NAND flash memory system according to the first embodiment. FIGS. 7A and 7B both show the threshold voltage distributions of the memory cells on the even BL pages (hereinafter, "memory cells MCn_even") connected to the word line WLn after writing the U page of memory cells MCn_even. FIG. 7A shows the threshold voltage distributions of the memory cells MCn_even right after writing the U page of the memory cells MCn_even. At this time, the U page of the memory cells on the odd BL page (hereinafter, "memory cells MCn_odd") connected to the word line WLn is not written yet. FIG. 7B shows the threshold voltage distributions of the memory cells MCn_even after the U page of the memory cells MCn_odd is written. Note that the memory cells MCn_even and the memory cells MCn_odd are connected to the selected word line WLn and are adjacent to each other. Furthermore, writing the U page of the memory cells MCn_odd is performed after writing the U page of the memory cells MCn_even. Accordingly, the U page of the memory cells MCn_even are affected by the inter-cell interference effect due to writing data to the memory cells MCn_odd. That is, as shown in FIGS. 7A and 7B, the threshold voltage distributions of the selected memory cells MCn_even shift under the influence of the inter-cell interference effect, depending on whether writing the U page of the adjacent memory cells MCn_odd is performed.

In the first embodiment, as shown in FIG. 7A, when the U page of the adjacent memory cells MCn_odd is not written, the read levels at the time of reading data are set to AR_1, BR_1, and CR_1. As shown in FIG. 7B, when the U page of the adjacent memory cells MCn_odd is already written, the read levels at the time of reading data are set to AR_2, BR_2, and CR_2. When writing the U page of the adjacent memory cells MCn_odd is performed, the threshold voltage distributions of the memory cells shift to the high voltage side. Due to this, the read levels AR_2, BR_2 and CR_2 are set to be higher than the read levels AR_1, BR_1 and CR_1, respectively, by a shift amount of each threshold voltage distribution. The shift amount of the threshold distribution can be obtained by statistically calculating changes in the threshold distributions of the selected memory cells MCn_even between before and after writing the U page of the adjacent memory cells MCn_odd based on a plurality of measurement results. For example, the shift amount of the threshold voltage distribution can be set to an average value of actual changes in the threshold voltage distributions of the selected memory cells MCn_even.

As described above, the threshold voltage distributions shift to the low voltage side over time after writing data. Accordingly, each read level is set between the adjacent threshold voltage distributions near the lower threshold voltage distribution. For example, the read levels AR_1, BR_1, and CR_1 are set near high-voltage ends of the threshold voltage distributions E, A, and B shown in FIG. 7A, respectively. The read levels AR_2, BR_2, and CR_2 are set near high-voltage ends of the threshold voltage distributions E, A, and B shown in FIG. 7B, respectively. By setting the read levels as described above, reading data with high reliability can be guaranteed even when the threshold voltage distributions shift to the low voltage side over time.

To change the read levels of the selected memory cells MCn_even at the time of reading data depending on the data write state of the adjacent memory cells MCn_odd, that is whether the U page of the adjacent memory cells MCn_odd is already written, the controller 11 changes a command to be transmitted to the NAND chip 10.

For example, when the controller 11 includes such means as a memory that stores the information of pages to which writing data is already performed, the controller 11 can determine whether the U page of the adjacent memory cells MCn_odd is written. In this case, the controller 11 stores information about up to which U pages among pages "1" to "128" shown in FIG. 6 data is already written. When the adjacent memory cells MCn_odd connected to the word line WLn is not written yet, the controller 11 issues a first command CA for selecting AR_1, BR_1, and CR_1 as the read levels to be applied when reading data from the selected memory cells MCn_even connected to the word line WLn. The NAND chip 10 can thereby select AR_1, BR_1, and CR_1 as the read levels and the sense amplifier circuits SA can thereby detect data in the U pages of the selected memory cells MCn_even.

On the other hand, when the U page of the adjacent memory cells MCn_odd is already written, the controller 11 issues a second command CB for selecting AR_2, BR_2, and CR_2 as the read levels to be applied when reading data from the selected memory cells MCn_even. The NAND chip 10 can thereby select AR_2, BR_2, and CR_2 as the read levels and the sense amplifier circuits SA can thereby detect data in the U pages of the selected memory cells MCn_even.

In this way, the NAND chip 10 changes the read levels to be applied to the selected word line WLn depending on the data write state of (whether writing data is already performed to) the memory cells MCn_odd connected to the odd BL page when reading data from the memory cells MCn_even connected to the even BL page. The controller 11 controls the NAND chip 10 to change the read levels as described above.

In the first embodiment, in the write operation, the U page of the memory cells MCn_odd connected to the odd BL page is written after the U pages of the memory cells MCn_even connected to the even BL page is written. However, the data write order can be reversed. That is, the U page of the memory cells MCn_even connected to the even BL page is written after the U page of the memory cells MCn_odd connected to the odd BL page is written. In this case, the NAND chip 10 changes the read levels to be applied to the selected word line WLn depending on the data write state of (whether writing data is already performed to) the memory cells MCn_even connected to the even BL page when reading data from the memory cells MCn_odd connected to the odd BL page.

The effects of the first embodiment can be maintained even when the memory system operates this way.

The memory system according to the first embodiment changes the read levels to be applied the selected word line when reading data from the selected memory cells belonging to either the even BL page or the odd BL page on the selected word line, depending on the data write state of the adjacent memory cells belonging to the other page. The memory system can thereby change the read levels according to the shift of the threshold voltage distributions of the selected memory cells caused by the inter-cell interference effect. Accordingly, irrespectively of whether writing data to the adjacent memory cells is already performed, it is possible to set wide margins between the threshold voltage distributions and the read levels at the time of reading data. This can improve the reliability of reading data.

Alternatively, the read levels can be automatically changed in the NAND chip 10 after reading either the even or odd BL page that is written later, and then confirming the data write state of the BL page. For example, the data write state of the BL page is written in a predetermined column in the BL page, when writing U page of the BL page is performed. In this case, however, time is required to read the data write state from the BL page, resulting in longer total read time. In the memory system according to the first embodiment, the controller 11 issues different commands according to the data write state of adjacent memory cells (the data write state of the adjacent BL page) using the fact that the controller 11 stores the information of the pages to which writing data is already performed, and the NAND chip 10 changes the read levels accordingly. Therefore, it is possible to improve the reliability of the memory system according to the first embodiment at a time of reading data without extending time required to reading data.

(Second Embodiment)

In the first embodiment, the controller 11 stores the information of the pages to which writing data is already performed. However, the controller 11 sometimes manages a write state for each block configured to include a plurality of pages, for example. In this case, the controller 11 cannot determine whether the U page of the memory cells on the even BL page or odd BL page because the controller 11 does not manage the write state on the page basis.

Therefore, when reading data from the selected memory cells belonging to either the even BL page or the odd BL page which is written first, a memory system according to a second embodiment checks the data write state of the adjacent memory cells belonging to the other page. For example, when reading data from the selected memory cells belonging to the even BL page connected to the word line WLn is performed, reading data from the adjacent memory cells belonging to the odd BL page connected to the word line WLn is also performed. At this time, the controller 11 or the NAND chip 10 determines whether U page of the odd BL page on the word line WLn is written, by referring to information (an flag) that is simultaneously written to a predetermined column in the same U page at the time of writing data to the U page, so as to indicate whether the U page is already written. The flag is flag information asserted when the U page is written. Depending on the flag information, either the read levels can be automatically changed in the NAND chip 10 or the NAND chip 10 can change the read levels according to another command issued by the controller 11.

The configuration and other operations of the memory system according to the second embodiment can be identical to those of the memory system according to the first embodiment.

There are cases where write data is randomized so as to equalize the numbers of memory cells belonging to the threshold distributions E, A, B, and C. In these cases, the controller 11 or the NAND chip 10 can refer to whether data belonging to the threshold voltage distribution C is included in data read from the odd BL page instead of referring to the flag. When the write data is randomized, the write data is converted so as to belong to the threshold distributions E, A, B, and C with the same probability. When the U page of the memory cells on the odd BL page is written, the memory cells belonging to the threshold voltage distribution C are always included in the page. Accordingly, it is possible to determine that the U page of the memory cells on the odd BL page is already written when the memory cells belonging to the threshold voltage distribution C are included in the odd BL page. Conversely, it is possible to determine that the U page on the odd BL page is not written yet when the memory cells belonging to the threshold voltage distribution C are not included in the odd BL pages.

Either the controller 11 or the NAND chip 10 can determine whether the U pages is written according to the flag or according to the existence of memory cells belonging to the threshold voltage distribution C.

Thereafter, as explained with reference to FIGS. 7A and 7B, when reading data from the selected memory cells belonging to either the even BL page or the odd BL page, the memory system changes the read levels depending on the data write state of the adjacent memory cells belonging to the other page. In this way, the operation for changing the read levels at the time of reading data is the same as that according to the first embodiment. For example, the NAND chip 10 changes the read levels to be applied to the selected word line WLn according to the data write state of (whether writing data is already performed to) the memory cells MCn_odd connected to the odd BL page when reading data from the memory cells MCn_even connected to the even BL page. Therefore, the second embodiment can also achieve the effects of the first embodiment.

However, according to the second embodiment, when reading data from the memory cells belonging to the read-target even BL page is performed, reading data is performed not only from the memory cells belonging to the even BL page but also from the memory cells belonging to the odd BL page. Therefore, in the second embodiment, the number of read operations increases by one, that is, the reading data is performed twice.

(Third Embodiment)

In a third embodiment of the present invention, the NAND controller 11 stores information of pages to which writing data is already performed and also stores a W/E (write/erase) count of each cell block. The NAND chip 10 thereby changes the read levels to be applied to the selected word line at the time of reading data according to the data write state of the adjacent memory cells and according to the W/E count of the cell block to which the selected memory cells belong. The W/E count indicates the number of executions of write/erase operations to each cell block BLK. As the W/E count of a certain cell block BLK increases, the inter-cell interference effect of the cell block BLK generally increases. That is, as the W/E count of the cell block BLK to which the selected memory cells MCn_even belong increases, the shift amount of the threshold distributions of the selected memory cells MCn_even after writing data to the adjacent memory cells MCn_odd increases. Therefore, in the third embodiment, the NAND chip 10 appropriately changes the read levels in view of not only the data write state of the adjacent memory cells but also the W/E count of the cell block BLK to which the selected memory cells belong.

FIGS. 8A and 8B show relations between threshold distributions and read levels of a NAND flash memory system according to the third embodiment. FIGS. 8A and 8B both show the threshold voltage distributions of the U pages of the memory cells MCn_even. FIG. 8A shows the threshold voltage distributions of the memory cells MCn_even right after data is written to the U pages of the memory cells MCn_even. That is, FIG. 8A shows the threshold voltage distributions of the memory cells MCn_even after writing data is performed to the U page of the memory cells MCn_even and before writing data is performed to the U page of the memory cells MCn_odd. FIG. 8B shows the threshold voltage distributions of the memory cells MCn_even after writing data to the U page of the memory cells MCn_odd.

Distributions E20, A20, B20, and C20 shown in FIG. 8B are distributions when the W/E count of the cell block BLK to which the selected memory cells MCn_even belong is relatively low. Distributions E21, A21, B21, and C21 shown by dashed lines are distributions when the W/E count of the cell block BLK to which the selected memory cells MCn_even belong is relatively large. As can be understood from FIGS. 8A and 8B, the shift amount of the threshold voltage distributions of the selected memory cells MCn_even after writing data to the U page of the adjacent memory cells MCn_odd changes according to the W/E count of the cell block BLK to which the selected memory cells MCn_even belong.

For example, when the U page of the adjacent memory cells MCn_odd connected to the word line WLn is not written yet, the NAND controller 11 issues the first command CA for selecting the read levels AR_1, BR_1, and CR_1 to be applied when reading data from the U page of the selected memory cells MCn_even connected to the word line WLn. The NAND chip 10 can thereby select AR_1, BR_1, and CR_1 as the read levels and the sense amplifier circuits SA can thereby detect data in the U page of the selected memory cells MCn_even.

When data the U page of the adjacent memory cells MCn_odd is already written and the W/E count of the cell block BLK to which the selected memory cells MCn_even belong is equal to or lower than a predetermined value, the NAND controller 11 issues the second command CB for selecting AR_2, BR_2, and CR_2 as read levels to be applied when reading data from the U page of the selected memory cells MCn_even. The NAND chip 10 can thereby select AR_2, BR_2, and CR_2 as the read levels and the sense amplifier circuits SA can thereby detect data in the U page of the selected memory cells MCn_even. Note that the predetermined value of the W/E count is previously stored in, for example, a memory of the NAND controller 11 and held by the NAND controller 11.

When the U page of the adjacent memory cells MCn_odd is already written and the W/E count of the cell block BLK to which the selected memory cells MCn_even belong exceeds the predetermined value, the NAND controller 11 issues a third command CC for selecting AR_3, BR_3, and CR_3 as read levels to be applied when reading data from the U page of the selected memory cells MCn_even. The NAND chip 10 can thereby select AR_3, BR_3, and CR_3 as the read level and the sense amplifier circuits SA can thereby detect data in the U page of the selected memory cells MCn_even.

In this way, the NAND controller 11 uses the higher read levels AR_3, BR_3, and CR_3 than the read levels AR_2, BR_2, and CR_2 instead thereof when the U page of the adjacent memory cells MCn_odd is already written and the W/E count of the cell block BLK to which the selected memory cells MCn_even belong is high. A difference ($\Delta$RL23) between AR_2 and AR_3, between BR_2 and BR_3, or between CR_2 and CR_3 can be set equal to the voltage difference ($\Delta$Vshift) between a high-voltage end of each of the threshold distributions E, A, and B when the W/E count is low (for example, when the W/E count is less than 100) and a high-voltage end of each of the threshold distributions E, A, and B when the W/E count is high (for example, when the W/E count is equal to or higher than a half of a guaranteed value of the W/E count). The predetermined value for determining whether the W/E count is high or low can be a half of the guaranteed value of the W/E count, for example.

In other words, the read levels, at the time of reading data from the selected memory cells MCn_even after writing data to the U pages of the adjacent memory cells MCn_odd, are set to be higher by $\Delta$RL12 than the read levels AR_1, BR_1, and CR_1, respectively, applied before the U page of the adjacent memory cells MCn_odd is written in a case in which the W/E count is equal to or lower than the predetermined value, and to be higher by $\Delta$RL13 in a case in which the W/E count is higher than the predetermined value.

In this way, the NAND chip 10 changes the read levels applied to the selected word line WLn at the time of reading data from the memory cells MCn_even according to not only the data write state of the adjacent memory cells MCn_odd but also the W/E count of the cell block BLK to which the selected memory cells MCn_even belong. According to the third embodiment, therefore, it is possible to appropriately change the read levels applied to the selected word line WLn in view of the influence of the inter-cell interference effect that changes according to the W/E count of the cell block BLK. As a result, the third embodiment can further improve the reliability of reading data. Needless to say, the third embodiment can also achieve the effects of the first embodiment.

In the third embodiment, the controller 11 changes the read levels (AR_i, BR_i, and CR_i (where i is an integer)) by using the different commands (CA, CB, and CC). Alternatively, the NAND controller 11 can transmit a command for changing the shift amount of the read levels to the NAND chip 10. In this alternative, the NAND chip 10 changes the read levels by the shift amount.

While the number of sets of read levels is three in the third embodiment, four or more sets of read levels can be used.

For example, the NAND controller 11 can change the read levels in three or more steps according to the W/E count.

(Fourth Embodiment)

In the first to third embodiments, the read levels are changed in view of the inter-cell interference effect caused by the adjacent memory cells connected to the adjacent bit lines. However, as shown in FIG. 6, the adjacent memory cells are arranged not only along the adjacent bit lines but also along the adjacent word lines. For example, the memory cells adjacent to the memory cells MC1 are not only the memory cells MC2 but also the memory cells MC3.

Therefore, the controller 11 according to a fourth embodiment of the present invention changes the read levels to be applied to the selected word line WLn depending on the data write state of the memory cells connected to the word line WLn+1 adjacent to the selected word line WLn when reading data from the memory cells connected to the selected word line WLn. The configuration of the memory system according to the fourth embodiment can be identical to that in the first embodiment.

FIGS. 9A and 9B show relations between threshold voltage distributions and read levels of a NAND flash memory system according to the fourth embodiment. FIGS. 9A and 9B both show the threshold voltage distributions of the U pages of the memory cells MCn_even on the even BL pages connected to the selected word line WLn. FIG. 9A shows the threshold voltage distributions of the memory cells MCn_even right after the U page of the memory cells MCn_even is written. At this time, the U page of the memory cells on the even BL pages connected to the word line WLn+1 adjacent to the word line WLn (hereinafter, "memory cells MCn+1_even") is not written yet. FIG. 9B shows the threshold voltage distributions of the memory cells MCn_even after the U page of the memory cells MCn+1_even is written. Note that the memory cells MCn_even and MCn+1_even are connected to the word line WLn and the word line WLn+1 adjacent to each other, respectively, and are connected to common bit lines. Therefore, the memory cells MCn_even and the memory cells MCn+1_even are adjacent to one another. Furthermore, the U page of the memory cells MCn+1_even is written after the U page of the memory cells MCn_even is written. For example, the U page of the memory cells MC1 shown in FIG. 6 is the fifth in the data write order whereas the U page of the memory cells MC3 adjacent to the memory cells MC1 is the ninth. Accordingly, the U pages of the memory cells MCn_even are affected by the inter-cell interference effect due to writing data to the memory cells MCn+1_even. That is, as shown in FIGS. 9A and 9B, the threshold voltage distributions of the selected memory cells MCn_even shift because of the inter-cell interference effect depending on whether the U page of the adjacent memory cells MCn+1_even is written or not. Therefore, in the fourth embodiment, when the U page of the adjacent memory cells MCn+1_even is not written yet, the read levels applied at the time of reading data from the U page of the memory cells MCn_even are set to AR_11, BR_11, and CR_11 as shown in FIG. 9A. When the U page of the adjacent memory cells MCn+1_even is already written, the read levels applied at the time of reading data from the U page of the memory cells MCn_even are set to AR_12, BR_12, and CR_12 as shown in FIG. 9B. When the U page of the adjacent memory cells MCn+1_even is written, the threshold voltage distributions of the memory cells shift to the high voltage side. Due to this, the read levels AR_12, BR_12, and CR_12 are set higher than the read levels AR_11, BR_11, and CR_11, respectively, by the shift amounts of the threshold voltage distributions. At this time, the shift amount of the threshold voltage distributions can be obtained by statistically calculating changes in the threshold voltage distributions of the selected memory cells MCn_even between before and after writing data to the U pages of the adjacent memory cells MCn+1_even based on plural measurement results.

As described above, the threshold voltage distributions shift to the low voltage side over time after writing data. Accordingly, each read level is set between the two adjacent threshold voltage distributions near the lower threshold voltage distribution of the two distributions. For example, the read levels AR_11, BR_11, and CR_11 are set near high-voltage ends of the distributions E, A, and B shown in FIG. 9A, respectively. The read levels AR_12, BR_12, and CR_12 are set near high-voltage ends of the distributions E, A, and B shown in FIG. 9B, respectively. By so setting, initially-set read levels can be used as they are even when the threshold voltage distributions shift to the low voltage side over time.

To change the read levels of the selected memory cells MCn_even at the time of reading data depending whether the U page of the adjacent memory cells MCn+1_even is written, the NAND controller 11 changes a command to be transmitted to the NAND chip 10 depending on the data write state of the adjacent memory cells MCn+1_even.

For example, when the NAND controller 11 includes the memory that stores the information of pages to which writing data is already performed, the NAND controller 11 can determine whether the U page of the adjacent memory cells MCn+1_even is written. When the U page of the adjacent memory cells MCn+1_even connected to the word line WLn+1 is not written yet, the NAND controller 11 issues a fourth command CD for selecting AR_11, BR_11, and CR_11 as the read levels to be applied when reading data from the U page of the selected memory cells MCn_even connected to the word line WLn. The NAND chip 10 can thereby select AR_11, BR_11, and CR_11 as the read levels and the sense amplifier circuits SA can thereby detect data in the U pages of the selected memory cells MCn_even.

On the other hand, when the U page of the adjacent memory cells MCn+1_even is already written, the NAND controller 11 issues a fifth command CE for selecting AR_12, BR_12, and CR_12 as the read levels to be applied when reading data from the U page of the selected memory cells MCn_even. The NAND chip 10 can thereby select AR_12, BR_12, and CR_12 as the read levels and the sense amplifier circuits SA can thereby detect data in the U page of the selected memory cells MCn_even.

In this way, the NAND chip 10 changes the read levels applied to the selected word line WLn at the time of reading operation depending on the data write state of (according to whether writing data is already performed to) the adjacent memory cells MCn+1_even connected to the word line WLn+1 adjacent to the selected word line WLn when reading data from the U page of the memory cells MCn_even connected to the selected word line WLn. The NAND controller 11 controls the NAND chip 10 to change the read levels as described above.

The memory system according to the fourth embodiment changes the read levels according to the data write state of (according to whether writing data is already performed to) the page to which writing data is performed after writing data is performed to the read-target page and which page corresponds to the word line adjacent to the word line corresponding to the read-target page. Therefore, the memory system according to the fourth embodiment can achieve identical effects as those according to the first embodiment.

The fourth embodiment can be combined with either the first or second embodiment.

In this case, each read level can be changed to three different values so as to deal with the inter-cell interference effect from plural adjacent memory cells of each selected memory cell. For example, when the memory cells MC1 shown in FIG. 6 are the selected memory cells, the adjacent memory cells that have the inter-cell interference effects on each of the selected memory cells MC1 are two memory cells MC2 and one memory cell MC3. Therefore, cases can be classified into the following three cases: a case 1 where data is written yet to neither the adjacent memory cells MC2 nor MC3; a case 2 where data is written to the adjacent memory cells MC2 but not written yet to the adjacent memory cell MC3; and a case 3 where data is written to both the adjacent memory cells MC2 and MC3. By setting different read levels according to the cases 1 to 3, it is possible to deal with the inter-cell interference effect. Furthermore, the fourth embodiment can be combined with the third embodiment. That is, in the fourth embodiment, the read levels can be changed according to the W/E count. Accordingly, the fourth embodiment can achieve effects identical as those of the third embodiment.

The fourth embodiment can be applied to the ABL method instead of being applied to the first to third embodiments. In this case, the fourth embodiment superficially resembles the Technique 2 . However, in the fourth embodiment, there is no need to read data from the memory cells connected to the adjacent word line WLn+1 and no need to read data plural times from the memory cells connected to the selected word line WLn at plural read levels. Therefore, even when the memory system according to the fourth embodiment is combined with the ABL method, the time required for reading data can be reduced as compared to the Technique 2.

(Fifth Embodiment)

In the fourth embodiment, the controller 11 stores the information of the pages to which writing data is already performed. However, as described in the second embodiment, the NAND controller 11 sometimes cannot determine whether the U page of the memory cells on the even BL pages or odd BL pages is written.

Therefore, a memory system according to a fifth embodiment of the present invention checks the data write state of (whether writing data is already performed to) a page to which data is written after data is written to a read-target page and which page corresponds to a word line adjacent to a word line corresponding to the read-target page. For example, when reading data is performed from the selected memory cells MCn_even connected to the word line WLn, reading data is also performed from the adjacent memory cells MCn+1_even connected to the word line WLn+1. At this time, the NAND controller 11 or the NAND chip 10 determines whether writing data is already performed to the adjacent memory cells MCn+1_even by referring to the flag read simultaneously with the read data. Therefore, the fifth embodiment is a combination of the second and fourth embodiments.

The configuration and other operations of the memory system according to the fifth embodiment can be identical to those of the memory system according to the fourth embodiment.

When the write data is randomized, the NAND controller 11 or the NAND chip 10 can refer to whether data belonging to the threshold distribution C is included in the data in the adjacent memory cells MCn+1_even instead of referring to the flag as described above.

Thereafter, as described with reference to 9A and 9B, when reading data from the memory cells connected to the selected word line WLn, the memory system changes the read levels to be applied to the selected word line WLn according to the data write state of the memory cells connected to the adjacent word line WLn+1 adjacent to the selected word line WLn. In this way, the operation for changing the read levels at the time of reading data is the same as that according to the fourth embodiment. Therefore, the fifth embodiment can also achieve the effects of the fourth embodiment. Furthermore, the fifth embodiment can be combined with any of the first to third embodiments like the fourth embodiment.

However, according to the fifth embodiment, data is also read from the memory cells connected to the adjacent word line WLn+1 when reading data from the memory cells connected to the selected word line WLn as the data read target. Due to this, in the fifth embodiment, the number of read operations increases by one, that is, the reading is executed twice.

Meanwhile, there is a conventional way in which, for example, a memory reads data from the memory cells connected to the selected word line WLn plural times while changing read levels after reading data from the memory cells connected to the adjacent word line WLn+1. Compared with this conventional method, the number of times of reading data is smaller and the time required for reading data is shorter in the fifth embodiment.

While the case of reading data from a U page of the selected memory cells has been described in the first to fifth embodiment, the present invention is also applicable to a case of reading data from an L page of the selected memory cells. Moreover, while only the inter-cell interference effect caused by writing data to the U page of the adjacent memory cells has been considered, the inter-cell interference effect caused by writing data to the L page of the adjacent memory cells can be also considered.

When shorter data read time is required as in the case of an SSD (Solid State Drive) or the like, the data read time is too long in the conventional techniques. The memory system according to the embodiments of the present invention can be suitably applied to the SSD because the data read time is shorter as compared with the conventional techniques.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory system comprising:
a memory part comprising,
a memory cell array including a plurality of memory cells,
a plurality of word lines connected to control gates of the memory cells,
a plurality of bit lines connected to the memory cells, including bit line pairs each composed of an even bit line and an odd bit line adjacent to each other, and
sense amplifiers provided to the bit line pairs, respectively, and configured to detect data in selected memory cells connected to a selected word line among the word lines based on a current flowing through the selected memory cells; and
a controller configured to control the memory part, when reading data is performed from first memory cells to which writing data is performed first in memory cell pairs each composed of two adjacent memory cells respectively connected to one of the even bit lines and one of the odd bit lines, so as to change a read level voltage applied to the selected word line depending on a data write state of second memory cells in the memory cell pairs to which writing data is performed later.

2. The system of claim 1, wherein
different page addresses are allocated to the memory cells connected to the odd bit lines and the memory cells connected to the even bit lines, respectively,
the memory cell pairs are each connected to a same word line,
the controller controls the memory part to perform reading data with different read level voltages depending whether writing data to memory cells connected to the odd bit lines among the memory cell pairs is completed at a time of reading data from memory cell connected to the even bit lines among the memory cell pairs, in a case that writing data is performed to the memory cells connected to the odd bit lines among the memory cell pairs after writing data is performed to the memory cell connected to the even bit lines among the memory cell pairs, and
the controller controls the memory part to perform reading data with different read level voltages depending whether writing data to the memory cells connected to the even bit lines among the memory cell pairs is completed at a time of reading data from the memory cells connected to the odd bit lines among the memory cell pairs, in a case that writing data is performed to the memory cells connected to the even bit lines among the memory cell pairs after writing data is performed to the memory cells connected to the odd bit lines among the memory cell pairs.

3. The system of claim 1, wherein the controller performs reading data from the second memory cell in each of the memory cell pairs in order to determine the data write state of the second memory cells according to the data from the second memory cells, and
the controller controls the memory part, when reading data is performed from the first memory cells in each of the memory cell pairs, so as to change the read level voltage applied to the selected word line depending on the data write state of the second memory cells.

4. The system of claim 2, wherein the controller performs reading data from the second memory cells in each of the memory cell pairs in order to determine the data write state of the second memory cells based on the data in the second memory cells, and
the controller controls the memory part, when reading data is performed from the first memory cells in each of the memory cell pairs, so as to change the read level voltage applied to the selected word line depending on the data write state of the second memory cells.

5. The system of claim 1, wherein
the memory cells constitute a cell block serving as a data erase unit, and
the controller controls the memory part, when reading data is performed from the memory cells, so as to perform reading data with different read level voltages depending on a count of executions of writing data to and erasing data to the cell block to which the memory cells, from which reading data is performed, belong.

6. The system of claim 2, wherein
the memory cells constitute a cell block serving as a data erase unit, and
the controller controls the memory part, when reading data is performed from the memory cells, so as to perform reading data with different read level voltages depending on a count of executions of writing data to and erasing data to the cell block to which the memory cells, from which reading data is performed, belong.

7. The system of claim 3, wherein
the memory cells constitute a cell block serving as a data erase unit, and
the controller controls the memory part, when reading data is performed from the memory cells, so as to perform reading data with different read level voltages depending on a count of executions of writing data to and erasing data to the cell block to which the memory cells, from which reading data is performed, belong.

8. The system of claim 5, wherein
the controller changes the read level voltage to a first read level voltage when the count of executions of writing data to and erasing data to the cell block is equal to or lower than a predetermined value, and
the controller changes the read level voltage to a second read level voltage higher than the first read level when the count of executions of writing data to and erasing data to the cell block exceeds the predetermined value.

9. The system of claim 1, wherein the controller controls the memory part, when reading data is performed from the selected memory cells connected to the selected word line, so as to change the read level voltage applied to the selected word line depending on a data write state of adjacent memory cells connected to one of the word lines adjacent to the selected word line, the adjacent memory cells being adjacent to the selected memory cells, writing data being performed to the adjacent memory cells after writing data is performed to the selected memory cells.

10. The system of claim 2, wherein the controller controls the memory part, when reading data is performed from the selected memory cells connected to the selected word line, so as to change the read level voltage applied to the selected word line depending on a data write state of adjacent memory cells connected to one of the word lines adjacent to the selected word line, the adjacent memory cells being adjacent to the selected memory cells, writing data being performed to the adjacent memory cells after writing data is performed to the selected memory cells.

11. The system of claim 3, wherein the controller controls the memory part, when reading data is performed from the selected memory cells connected to the selected word line, so as to change the read level voltage applied to the selected word line depending on a data write state of adjacent memory cells connected to one of the word lines adjacent to the selected word line, the adjacent memory cells being adjacent to the selected memory cells, writing data being performed to the adjacent memory cells after writing data is performed to the selected memory cells.

12. The system of claim 5, wherein the controller controls the memory part, when reading data is performed from the selected memory cells connected to the selected word line, so as to change the read level voltage applied to the selected word line depending on a data write state of adjacent memory cells connected to one of the word lines adjacent to the selected word line, the adjacent memory cells being adjacent to the selected memory cells, writing data being performed to the adjacent memory cells after writing data is performed to the selected memory cells.

13. A memory system comprising:
a memory part comprising
a memory cell array including a plurality of memory cells,
a plurality of word lines connected to control gates of the memory cells, a plurality of bit lines connected to the memory cells, and sense amplifiers provided to pairs of the bit lines, respectively, and configured to detect data in selected memory cells connected to a selected word line among the word lines based on a current flowing through the selected memory cells; and a controller configured to control the memory part, when reading data is performed from the selected memory cells connected to the selected word line, so as to change a read level voltage applied to the selected word line depending on a data write state of adjacent memory cells connected to one of the word lines adjacent to the selected word line, the adjacent memory cells being adjacent to the selected memory cells, writing data being performed to the adjacent memory cells after writing data is performed to the selected memory cells.

* * * * *